United States Patent
McNeil

(10) Patent No.: US 6,943,396 B2
(45) Date of Patent: Sep. 13, 2005

(54) ELECTRO-STATIC DISCHARGE PROTECTION CIRCUIT AND METHOD FOR MAKING THE SAME

(75) Inventor: Grant McNeil, Williston, VT (US)

(73) Assignee: Infineon Technologies AG, Munich (DE)

(*) Notice: Subject to any disclaimer, the term of this patent is extended or adjusted under 35 U.S.C. 154(b) by 49 days.

(21) Appl. No.: 10/464,382

(22) Filed: Jun. 17, 2003

(65) Prior Publication Data

US 2004/0256675 A1 Dec. 23, 2004

(51) Int. Cl.[7] .................. H01L 27/108; H01L 29/76; H01L 29/94; H01L 31/119
(52) U.S. Cl. .................. 257/302; 257/301; 257/355; 438/242; 438/243; 438/306
(58) Field of Search .................. 257/355, 546, 257/547, 301, 302; 361/90, 91.1, 100; 438/242, 243, 386

(56) References Cited

U.S. PATENT DOCUMENTS

| | | | | |
|---|---|---|---|---|
| 5,182,220 A | * | 1/1993 | Ker et al. .................. 438/200 |
| 5,652,689 A | * | 7/1997 | Yuan .................. 361/56 |
| 6,157,065 A | * | 12/2000 | Huang et al. .................. 257/355 |
| 6,518,616 B2 | * | 2/2003 | Kudelka et al. .................. 257/301 |
| 6,777,737 B2 | * | 8/2004 | Mandelman et al. .................. 257/305 |
| 2002/0196651 A1 | | 12/2002 | Weis | |

* cited by examiner

Primary Examiner—Tom Thomas
Assistant Examiner—Edgardo Ortiz
(74) Attorney, Agent, or Firm—Slater & Matsil, L.L.P.

(57) ABSTRACT

As disclosed herein, an electrostatic discharge (ESD) protection circuit is provided for an integrated circuit including a semiconductor substrate. The ESD protection circuit includes a plurality of active devices formed in the semiconductor substrate, the active devices being formed by a process including a plurality of steps carried out to form, at the same time, a plurality of active devices having a function other than ESD protection. For example, the ESD circuit may include an array of vertical transistors formed according to a process including many of the steps used to form, at the same time, vertical transistors of a DRAM array. Also disclosed is the formation of an ESD circuit in an "unusable" area of a semiconductor chip, such as under a bond pad, land or under bump metallization of the chip.

21 Claims, 6 Drawing Sheets

ELECTRO-STATIC DISCHARGE PROTECTION CIRCUIT AND METHOD FOR MAKING THE SAME

BACKGROUND OF THE INVENTION

Electro-static discharge protection circuits (hereinafter "ESD circuits") are provided on many semiconductor integrated circuits (hereinafter "chips") to help prevent sudden failure due to discharge of static electricity through the chip by way of the chip's external terminals. Such failures, while once common, are much less common now that ESD circuits are widely used.

ESD circuits occupy fairly large areas of a chip in order to be ready to sink the large amount of current that can occur during an electro-static discharge. Static charges can have voltages measuring in the thousands of volts. Currents more than 100 times higher and sometimes more than 1000 times higher than that present during normal operation have been known to flow through a single external terminal of a packaged chip. If currents in such ranges are to be handled while preventing the chip from being permanently damaged, the current has to be spread out to devices, conductors, and/or the substrate, etc., in a manner such that no single such device or conductor conducts more current than it can safely handle. Otherwise, the consequences can be catastrophic: conductors can melt, reflow, and/or vaporize, and semiconductor materials can melt and/or recrystallize.

However, ESD circuits tend to occupy usable chip area that could otherwise be used for implementing the main function of the chip. It would be desirable to provide ESD circuits on an area of the chip that cannot ordinarily be used to implement the main function of the chip, thereby making more chip area available for such function.

Moreover, as is now practiced, some portions of a chip are generally considered unusable for implementing the main function of the chip. Such portions include parts of the chip, over which the bond pads or other external terminals, e.g. lands or under bump metallization of the chip are located. Such parts are considered unusable because of high heat and pressure that are applied there during the packaging process. Other parts of the chip, as well, are traditionally considered unusable, such as parts along the edges of the chip near locations where they are diced.

It would therefore be desirable to provide ESD circuits in such locations, especially under bond pads, that are traditionally considered unusable areas of the chip, thus preserving more usable area for that which implements the main function of the chip.

In addition, ESD protection circuits generally operate by a principle of avalanche breakdown due to an excessively high voltage placed across a reverse-biased diode, referenced to ground. The reverse-biased diode is conductively connected between the external terminal of the chip and ground, in parallel with wiring to functional circuitry of the chip. Under normal conditions, when static charges are not present, the reverse-biased diode does not conduct, because the breakdown voltage of the diode has not been reached. On the other hand, when a high voltage is present at the external terminal, such as an electrostatic voltage, the reverse-biased diode undergoes avalanche breakdown, and current flows between the external terminal and ground.

One way of achieving device operation similar to a reverse-biased diode is with a field effect transistor (FET) having its gate tied to a particular potential below its threshold voltage. Under some conditions, when a voltage below threshold is applied to the gate of an FET, the FET behaves like a reverse-biased diode. Like a reverse-biased diode, under normal conditions, when the source to drain voltage (Vds) is not high, the FET does not conduct, because of the reverse-biased pn junction between the drain and the channel of the FET. However, when Vds becomes sufficiently high, avalanche breakdown occurs, and the FET then conducts.

It would therefore be desirable to provide ESD circuits in an area of a chip that is ordinarily considered unusable for circuitry which supports the main function of the chip, such as an area under a bond pad.

It would further be desirable to form an ESD circuit at the same time as other devices on the same chip, by at least some of the same steps in a process used to form the other devices of the clip.

It would further be desirable to provide a compact ESD circuit utilizing a plurality of compact transistors such as those used in a dynamic random access memory (DRAM).

It would further be desirable to provide a compact ESD circuit utilizing a plurality of vertical transistors of an array of transistors formed substantially according to steps of a DRAM fabrication process.

SUMMARY OF THE INVENTION

Therefore, according to an aspect of the invention, an electro-static discharge (ESD) protection circuit is provided for an integrated circuit including a semiconductor substrate. The ESD protection circuit includes a plurality of active devices formed in the semiconductor substrate, the active devices being formed by a process including a plurality of steps carried out to form, at the same time, a plurality of active devices having a function other than ESD protection.

According to another aspect of the invention, a method is provided for fabricating an electrostatic discharge protection (ESD) circuit of an integrated circuit. The method includes forming an array of active devices of an ESD circuit by some of the same process steps by which arrays of active devices in non-ESD circuit areas of the integrated circuit are formed, providing a conductive path from a terminal of the integrated circuit to an input of the array of active devices, and providing a conductive path to ground from an output of the array of active devices of the ESD circuit.

DETAILED DESCRIPTION

Figure 1:
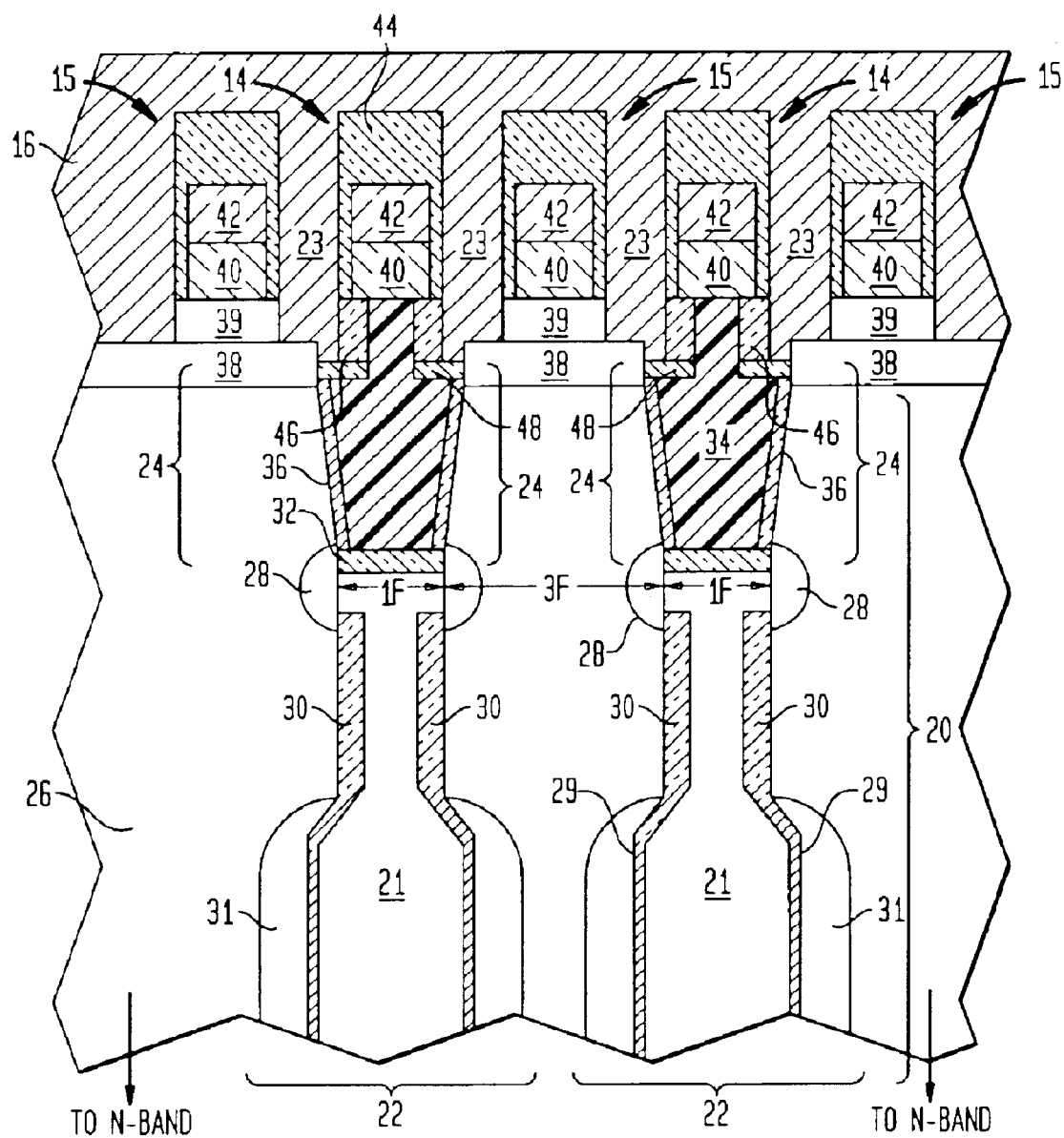
FIG. 1 is cross-sectional diagram illustrating an array of storage cells having vertical transistors of a DRAM array.

FIG. 1 is a cross sectional diagram illustrating an array of storage cells, such as may be provided in a dynamic random access memory (DRAM) and as described in commonly assigned published U.S. Patent Application No. US 002/ 0196651 A1. While the array of storage cells is described as background to the invention, it is not admitted to be prior art.

The ESD circuits described in the following embodiments is formed by a process similar to that used to form the storage cell array described herein, by many of the same steps of the process used to form the storage cell array. The illustrated cross section is shown in the direction of a bitline 16. As shown in FIG. 1, a storage capacitor 22 is formed within each deep trench 20 having a node electrode 21 forming one plate, a node dielectric 29, and a doped buried plate region 31 of the surrounding substrate being the other plate of the capacitor 22. Deep trench 20 also comprises trench collar oxide 30 and trench top oxide 32, which prevent parasitic current leakages. A heavily doped buried strap region 28 provides the source region of an access transistor 24 to which the storage capacitor 22 of deep trench 20 is conductively connected. An access transistor 24 is an active device, preferably an n-type field effect transistor (NFET), formed in a single crystal region of a semiconductor substrate.

In each deep trench 20, there are two access transistors 24, one formed on each side of the trench 20. Because there are two transistors on the sides of each deep trench, the overall gate width is doubled for a given gate length. In addition to the buried strap source region 28, access transistor 24 also includes doped gate polysilicon (hereinafter "poly") 34, formed within the upper region of deep trench 20, and gate oxide 36. Access transistors 24 also include drain regions 38, which are formed on both sides of the trench. Each drain region 38 is connected to the bitline 16 via bitline contacts 23.

As further shown in FIG. 1, the gate poly 34 is contacted by an active wordline 14. Note that other wordlines 15 are shown in FIG. 1. These wordlines are connected to other storage cells, but not the storage cells that are shown in the cross-section of FIG. 1. As such, those wordlines 15 are referred to as passing wordlines as per FIG. 1, whereas the wordline 14 contacting gate polysilicon 34 is referred to as an active wordline. In an exemplary embodiment, wordlines 14 and 15 consist of a low resistive conductor layer on an optional barrier layer such as a dual layer conductor formed of a first tungsten nitride (WN) or polysilicon/WN layer 40 over which is formed a tungsten or tungsten silicide (WSi) layer 42. The conductive layers are surrounded by a nitride insulating layer 44 to insulate the wordlines from the conductive bitline contacts 23 and the bitline 16. Additionally, gate poly 34 is insulated from adjacent features, such as drain regions 38, by an insulating spacer 46 and insulating cap 48. Spacer 46 is preferably formed of an oxide layer and cap 48 is preferably formed of a nitride. Other materials could be substituted depending upon the process flow, provided adequate isolation is provided to gate poly 34. The passing wordline 15 is insulated from the doped regions 38 by an array top oxide (ATO) 39.

As described above, each storage cell preferably includes two access transistors 24. Each transistor shares a common gate poly 34, but there are two gate oxides 36, two sources, i.e., buried strap diffusion regions 28, and two drains, i.e., doped diffusion regions 38. Note that each drain region 38 of each transistor 24 has two contacts 23 to the bitline 16. Note also that each transistor shares a common drain region 38 with a neighboring transistor of a neighboring deep trench 20.

Figure 2A:
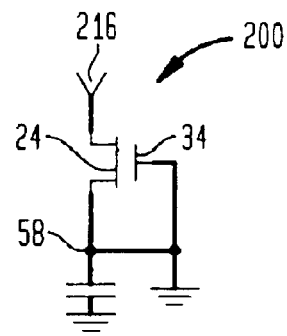
FIG. 2A is a schematic diagram illustrating the biasing of a transistor for use in an ESD circuit.

FIG. 2A is a schematic diagram illustrating the biasing of a transistor for use in an ESD circuit 200, the transistor having been formed by a similar process, preferably by many of the same steps, as that by which a transistor of the above-described DRAM array is formed. As shown in FIG. 2A, a conductor 216 couples a terminal of the chip, such as a bond pad, land, or under bump metallization of the chip to a drain end of the transistor 24, which is preferably an n-type FET. The access transistor 24 is an active device formed in a single crystal region of the semiconductor substrate. Both the source of the transistor 24 and the gate 34 of the transistor are grounded, as shown at 58. The gate 34 is grounded to bias the transistor 24 below its threshold voltage. Alternatively, the gate 34 can be held to a different, preferably fixed, potential below the threshold voltage of the transistor 24.

Such ESD circuit 200 is preferably located in an area of the chip that is considered unusable for circuitry which implements operational function(s) of the chip. Stated another way, the ESD circuit is preferably formed in an area of the chip which is generally not considered capable of supporting circuitry used in normal operation. The area of a chip that lies under an external terminal of the chip is such an area. The area under an external terminal of the chip is subject to risk of harm during the bonding process because of locally high levels of heat and/or pressure which may occur at that time. Operation within tolerances, reliability, testability and repairability of defects during post-fabrication test, are all concerns which weigh against implementing normal operational circuitry in such "unusable" areas. However, such concerns are not as strongly felt relative to the fabrication of ESD circuits. ESD circuits tolerate much variation in the manufacturing process, and do not require very high reliability, testability or repairability, so long as sufficient redundancy is built into the ESD circuit to handle the expected over current associated with an ESD event, despite the lack of reliability or even failure of some portion of the ESD circuit. Moreover, since the ESD circuit is fabricated in an area of the chip that is considered "unusable" for other purposes, redundancy can be built into the ESD circuit, without reducing the amount of chip area that is available for circuitry used in normal operation. In addition, the ESD circuit includes active devices 24 which are located primarily beneath the main surface of the single-crystal semiconductor region of the substrate, making them less vulnerable to such influences.

Figure 2B:
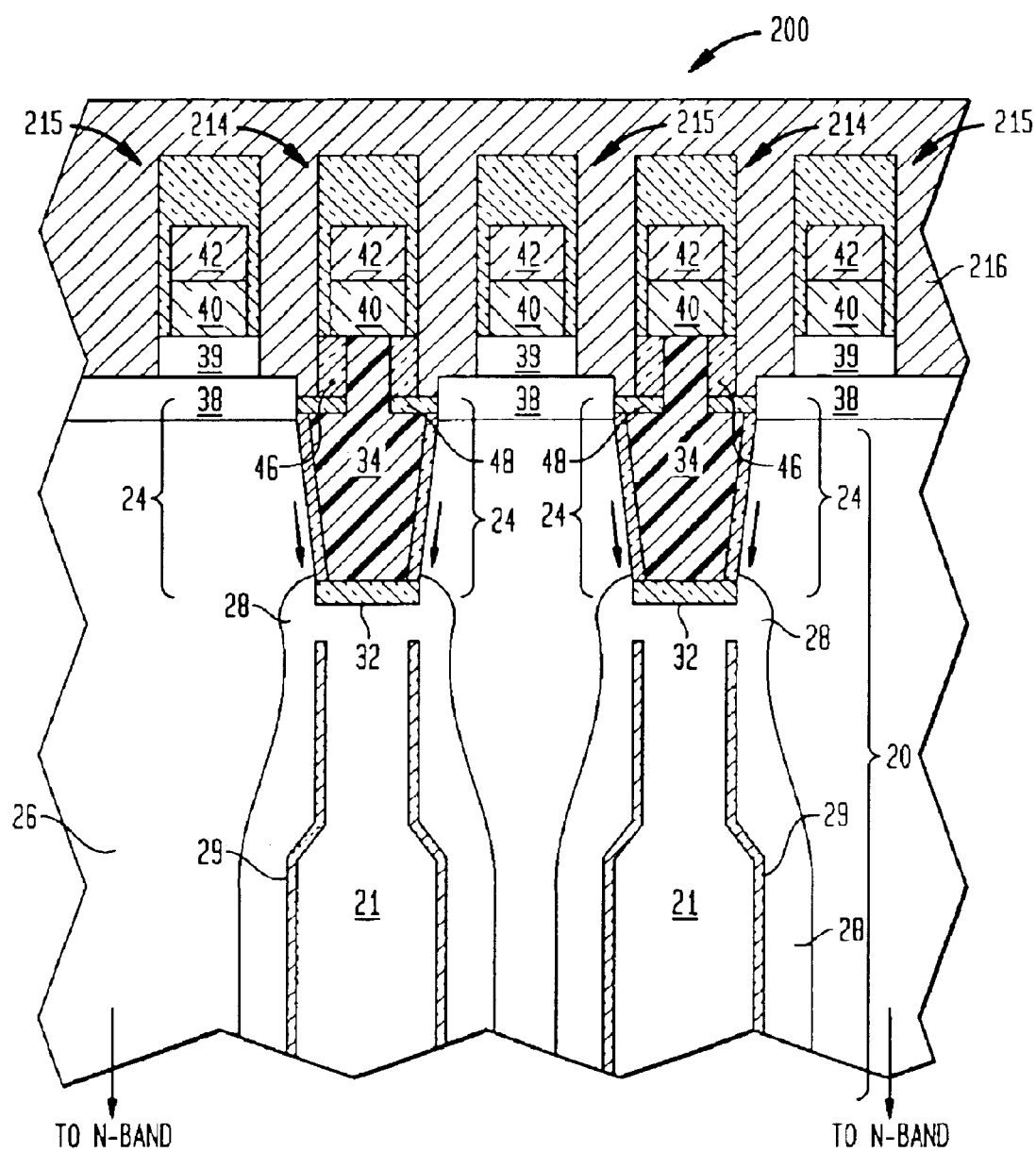
FIG. 2B is a cross-sectional diagram illustrating a first embodiment of an ESD circuit according to the invention.

FIG. 2B is a cross-sectional diagram further illustrating a first embodiment of an ESD circuit according to the invention. As shown in FIG. 2B, many of the structures are the same or similar to those shown and described above with reference to FIG. 1. In this embodiment, gate conductors 34 are held at ground, or other preferably fixed, potential. A plurality of gate biasing conductors 214 and 215 are provided which are coupled to ground, or other potential below the threshold voltage of transistors 24 for biasing gates 34 to that potential. A second conductor 216 is conductively connected to a terminal of the IC, especially an external terminal, which may or may not be the same as the bond pad under which the ESD circuit is preferably formed. The second conductor 216 is also conductively connected to drain diffusion regions 38, as shown in FIG. 2B.

Differences between FIG. 1 and FIG. 2B include the lack of a collar dielectric 30 in FIG. 2, which provides for an extended source region 28 in this embodiment of the invention. The source region 28 of the transistor extends downwardly, as joined to the region 31 usually referred to as the buried plate, within the volume surrounding trench 20 to a point connecting to a doped N-band layer (not shown) of the substrate 26, which connects the array of trenches 20 to a fixed potential such as ground. Trenches 20 are shown having node dielectric 29 still in place, separating node electrode 21 from the extended source region 28. This is a preferred, though not obligatory, arrangement for DRAM fabrication processes in which the gate dielectric 36 of transistors 24 is formed in a process sequence at the same time as the node dielectric 29. In such a process sequence, node dielectric 29 and gate dielectric 36 are formed together, because it would be more difficult to form only the gate dielectric 36 while omitting the node dielectric 29. However, when the gate dielectric 36 is formed at a different time than the node dielectric 29 would ordinarily be formed, or the process is otherwise altered, the node dielectric 29 can then be omitted from the process. In such case, source region 28 provides a conductive path to node electrode 21, which, in turn, provides a more highly conductive, parallel path to the source region 28 which surrounds the lower portion of the trench 20.

In an alternative embodiment, the trench 20 is formed without a node dielectric 29, but the collar dielectric 30 is present. The structure and interconnection of transistors 24 is otherwise the same as shown in FIG. 2B. In such case, the path from source region 28 to the fixed potential, such as ground, is through the node electrode 21 into a buried plate region surrounding the trench 20 (having a location corresponding to buried plate region 31 shown in FIG. 1), and then through the N-band conductive layer (not shown) coupled thereto to the fixed potential such as ground.

Figure 3:
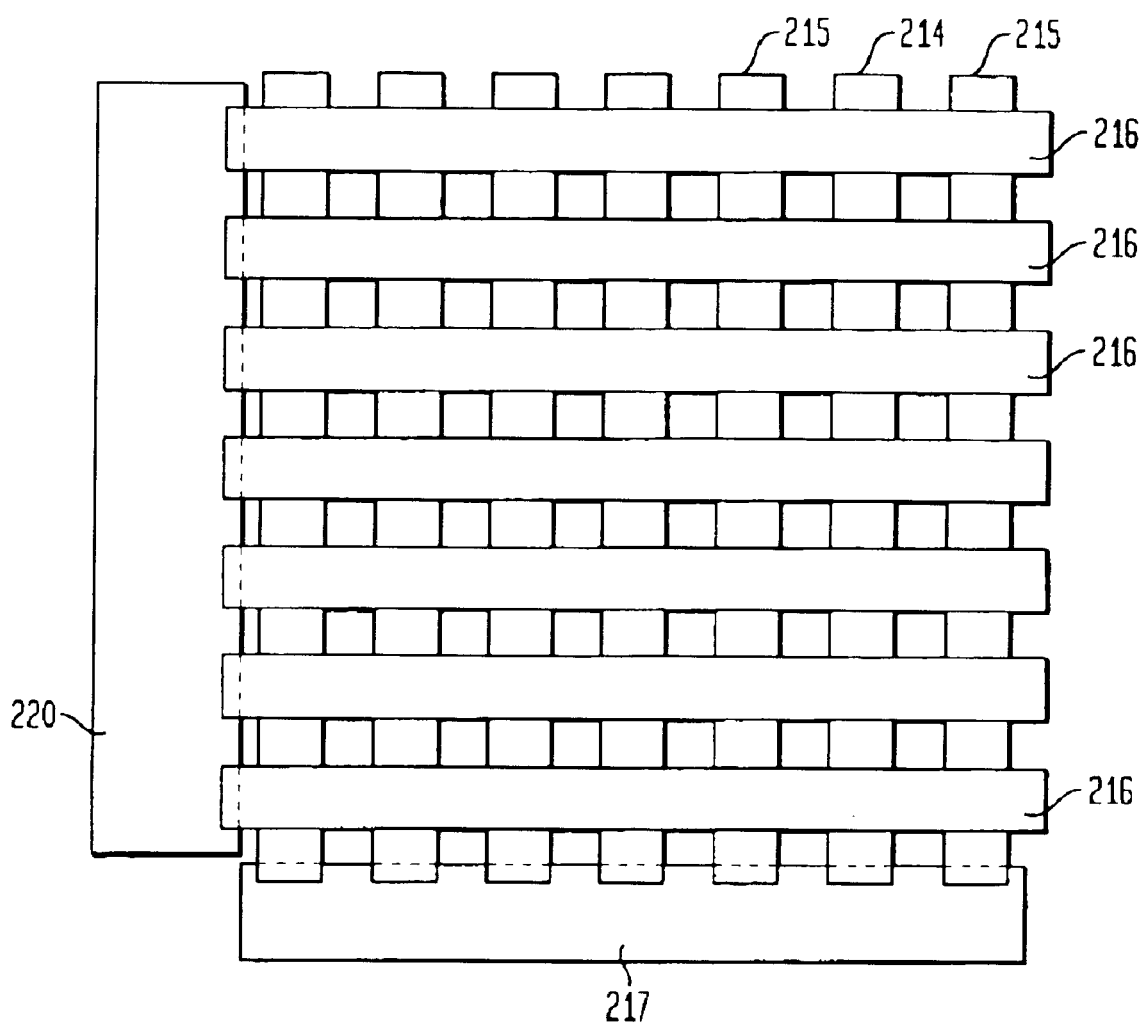
FIG. 3 is a plan view corresponding to FIGS. 2A and 2B, further illustrating a first embodiment of an ESD circuit.

FIG. 3 is a plan view illustrating an ESD circuit configuration corresponding to the embodiment shown in FIGS. 2A and 2B, fabricated according to a process similar to that of fabricating a DRAM array. As shown in FIG. 3, first conductors 214 and 215 are conductively connected by conductor 217 to a fixed potential, preferably being ground, to bias the gates of the transistors of an array of transistors located at intersections between first conductors 214 and 215 and second conductors 216, at a subthreshold voltage such as ground. Second conductors 216 conductively connect the drains of the transistors of the array to a conductor 220, which, in turn, is conductively connected to an external terminal of the chip.

It is estimated that each pair of access transistors 24 of a "cell" of a deep trench 20, (i.e. two transistors 24 per "cell") of an array of access transistors having the above-described structure, can conduct 30 microamperes (hereinafter "$\mu A$") of current in avalanche breakdown mode during an electrostatic discharge event. Thus, for various sizes of arrays of such access transistors, substantial currents can be conducted to the substrate. Moreover, according to conditions for fabricating an array of such transistors in a way that is substantially similar to a DRAM fabrication process, the area required for such transistor array can be determined. When it is considered that the area of a bond pad may be such as 90 microns$^2$ (hereinafter, "$\mu m^2$"), an ESD circuit formed of an array of vertical transistors underneath a bond pad of a chip can sink a considerable amount of current, as detailed in the Table 1 below:

TABLE 1

| Area ($\mu m^2$) | Number of cells | Current (35 $\mu A$/cell) |
|---|---|---|
| 10 | 900 | 31.5 mA |
| 20 | 3600 | 126 mA |
| 30 | 8100 | 284 mA |
| 40 | 14,400 | 504 mA |

TABLE 1-continued

| Area ($\mu m^2$) | Number of cells | Current (35 $\mu A$/cell) |
|---|---|---|
| 50 | 22,500 | 787 mA |
| 60 | 32,400 | 1.13 A |
| 70 | 44,100 | 1.54 A |
| 80 | 57,600 | 2.02 A |
| 90 | 72,900 | 2.55 A |

In operation, the ESD circuit functions as follows. Referring again to FIG. 2B, the dual transistors 24 of each trench 20 do not normally conduct, since the voltage applied to gate conductors 34 by first conductors 214 and 215 is at ground, or some other fixed potential below the threshold voltage of transistors 24. In normal operation, a potential difference may exist between the second conductor 216 and the source region 28, as the voltage on the second conductor 216 may be held at a fixed potential, such as when the ESD circuit 200 is connected to a power supply input terminal of the chip, or it may be cycled between levels, if the terminal is used for input or output, a clock, or a control signal of the chip, for example. In normal operation, such potential difference is insufficient to cause transistors 24 to conduct.

When an unusually high voltage, such as an electro-static voltage is presented to a terminal of the chip, that voltage is applied to the ESD circuit 200 through second conductor 216, and in turn, to drain regions 38. Transistors 24 having gates at subthreshold voltages, are biased for operating in a manner similar to that of a reverse-biased diode. The unusually high voltage creates a strong field within the channels of the transistors 24 (the areas outside the trenches 20 along gate dielectric 36 and denoted by arrows). The strong field causes avalanche breakdown to occur, causing a conductive path to arise between drain regions 38 and source regions 28. The source regions, in turn, conduct current downwardly to a conductive N-band region (not shown) of the substrate 26. The N-band region connects the sources regions 28 of each trench 20 to each other and to a fixed potential such as ground. Referring to FIG. 3, at such time, avalanche breakdown occurs within an array of vertical transistors provided at intersections between first conductors 214, 215, and second conductors 216. Thus, a parallel path to ground, or other fixed potential then exists within transistors of the array for an over current that arises when an unusually high voltage, such as an electro-static voltage, is placed on the terminal of the chip.

Figure 4:
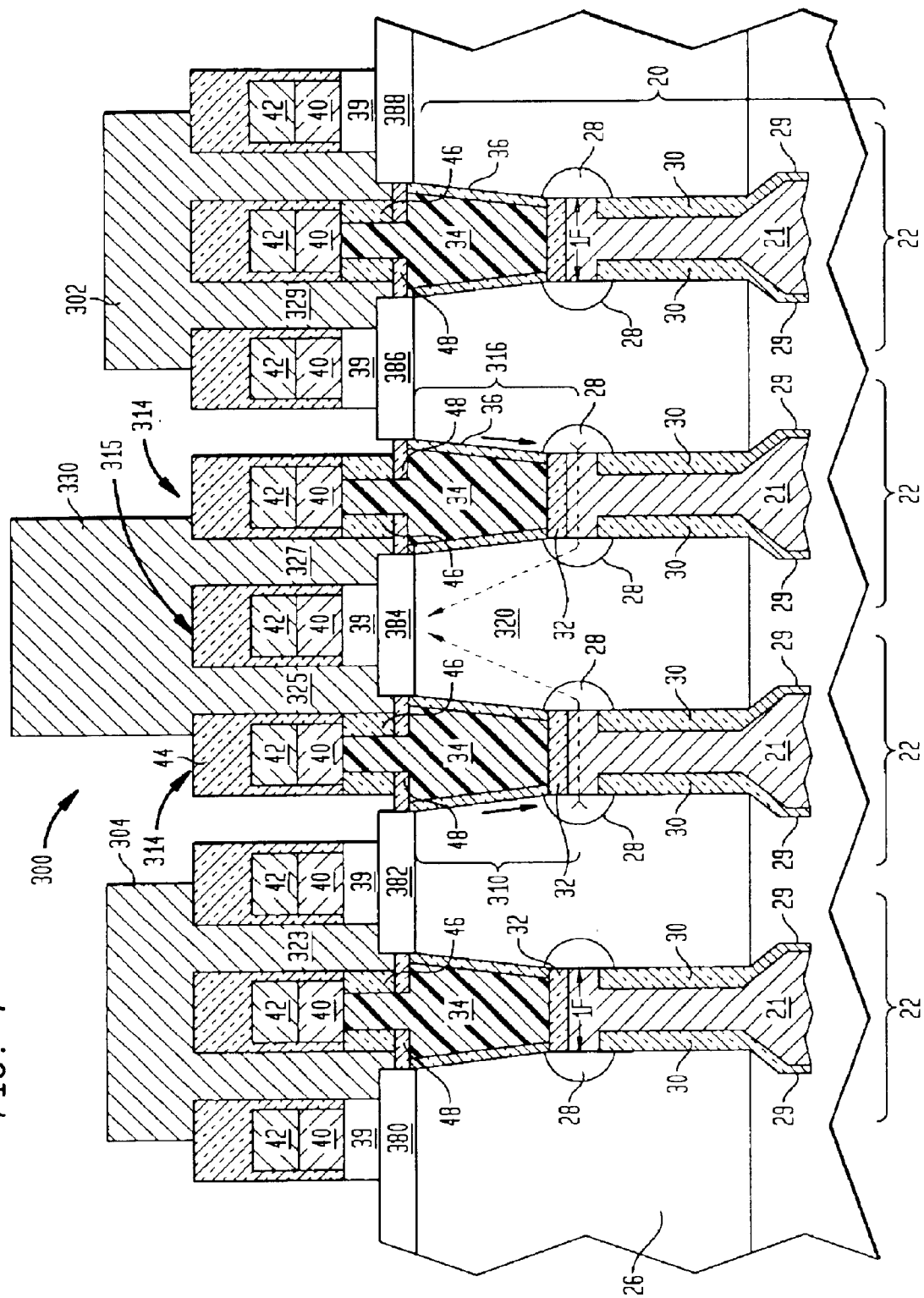
FIG. 4 is a cross-sectional diagram illustrating a second embodiment of the invention in which a connection is made through an n-type conductivity well.

FIG. 4 illustrates an alternative embodiment in which neither the node dielectric 29 nor the collar dielectric 30 of the usual DRAM fabrication process need to be omitted from the process of forming the ESD circuit 300. In this embodiment, a well 320 is formed in the single crystal semiconductor region of the substrate, under the passing conductor 315. Instead of forming the well having p-type conductivity, as is the case where transistors 310 and 316 are located, the well 320 has n-type conductivity, thus providing a conductive path up the opposite sides of the deep trenches to drain diffusion region 384 from source diffusion regions 28 of transistors 310 and 316. The drain region 384 is further coupled to a subthreshold potential, preferably being a fixed potential such as ground, through a "ground" conductor 330 having contacts 325 and 327 to the drain region 384 on sides of the passing conductor 315.

The ground conductor 330 preferably includes a lowermost portion of polycrystalline silicon ("poly") for providing contacts 325 and 327 to drain region 38. Alternatively, a silicide-forming metal such as tungsten can be deposited between first conductors 314 and 315 and thereafter annealed to form a low-resistance, self-aligned silicide contact such as tungsten silicide, or a silicide or a metal can be deposited to form contacts 325 and 327.

In FIG. 4, active conductors 314 bias the transistors 310 and 316 at a subthreshold voltage, preferably being a fixed potential such as a ground, at which, in normal operation, transistors 310 and 316 are turned off. Second conductor lines 302 and 304 allow the ESD circuit 300 form at least part of a conductive interconnection to a terminal of the chip such as an external terminal, e.g. a bondpad, land or under bump metallization.

Operation of the second embodiment is similar to the operation of the first embodiment. When an unusually high voltage, such as an electro-static voltage is presented to an external terminal of the chip, that voltage is applied to the ESD circuit 300 through second conductors 302, 304, and in turn, to drain regions 382 and 386. Transistors 310 and 316 of the ESD circuit remain biased, having gates at a subthreshold voltage, for operating in a manner similar to that of a reverse-biased diode. The unusually high voltage creates a strong field within the channels of the transistors 24 (the areas outside the trenches 20 along gate dielectric 36 and denoted by arrows). The strong field causes avalanche breakdown to occur, causing a conductive path to arise between the drain regions 382, 386 and the source regions 28 of the transistors 310 and 316. Those source regions 28, in turn, conduct current under the trench top oxides 32 through trenches 20, to source regions 28 on the other sides of trenches 20 from the transistors 310, 316, and through well 320 to drain region 384. The current is then further conducted to the fixed potential such as ground through ground conductor 330.

Figure 5:
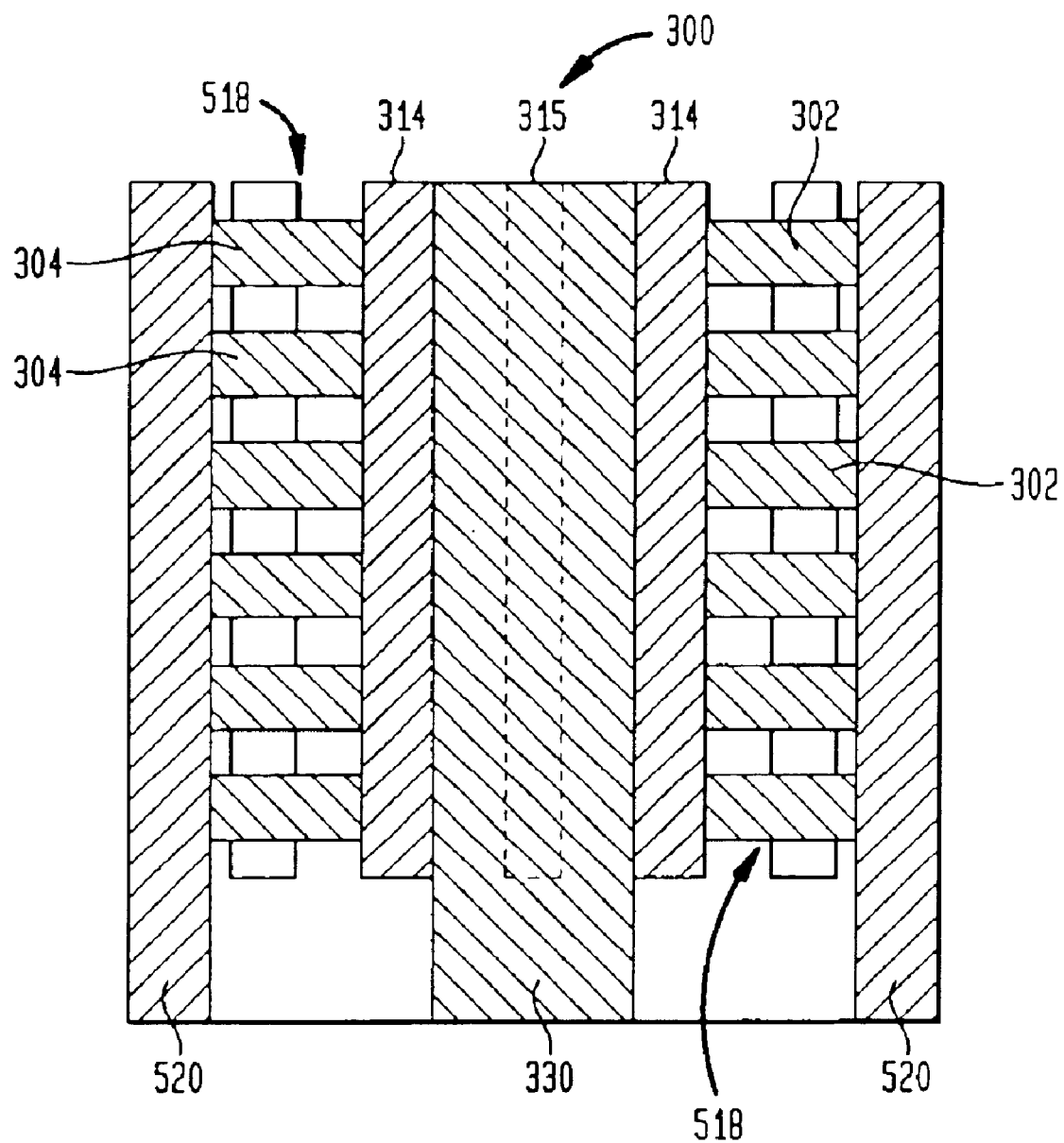
FIG. 5 is a plan view of a second embodiment of the invention corresponding to FIG. 4.

FIG. 5 is a plan view of the ESD circuit 300 shown in FIG. 4. Referring to FIG. 5, the ESD circuit 300 includes linear arrays 518 of vertical transistors (not shown in FIG. 5) having gates biased at a subthreshold voltage such as ground, by first conductors 314. The ESD circuit 300 provides conductive paths from second conductors 302, 304 to ground, or other such fixed potential, for an over current that can arise when an unusually high voltage, such as an electro-static voltage, is placed on a terminal connected to the ESD circuit. As shown in FIG. 5, the ESD circuit 300 has fingers 520, at least one of which is connected to second conductors 302, and at least one of which is connected to second conductors 304. Fingers 520, in turn, allow for a conductive connection to a terminal of the chip. Preferably, fingers 520 are conductively connected by one or more wiring levels to the terminal of the chip, which may be a bond pad, among others. In addition, one or more wiring levels may be formed over ground conductor 330 for providing a conductive path from conductor 330 to the fixed potential such as ground. The ESD circuit 300 can be repeated to fill the available chip area, such as the area of the chip otherwise considered "unusable" such that the ESD circuit 300 has sufficient area to sink the required amount of current for conditions expected in the event of a severe over voltage condition, such as an electro-static discharge.

Figure 6:
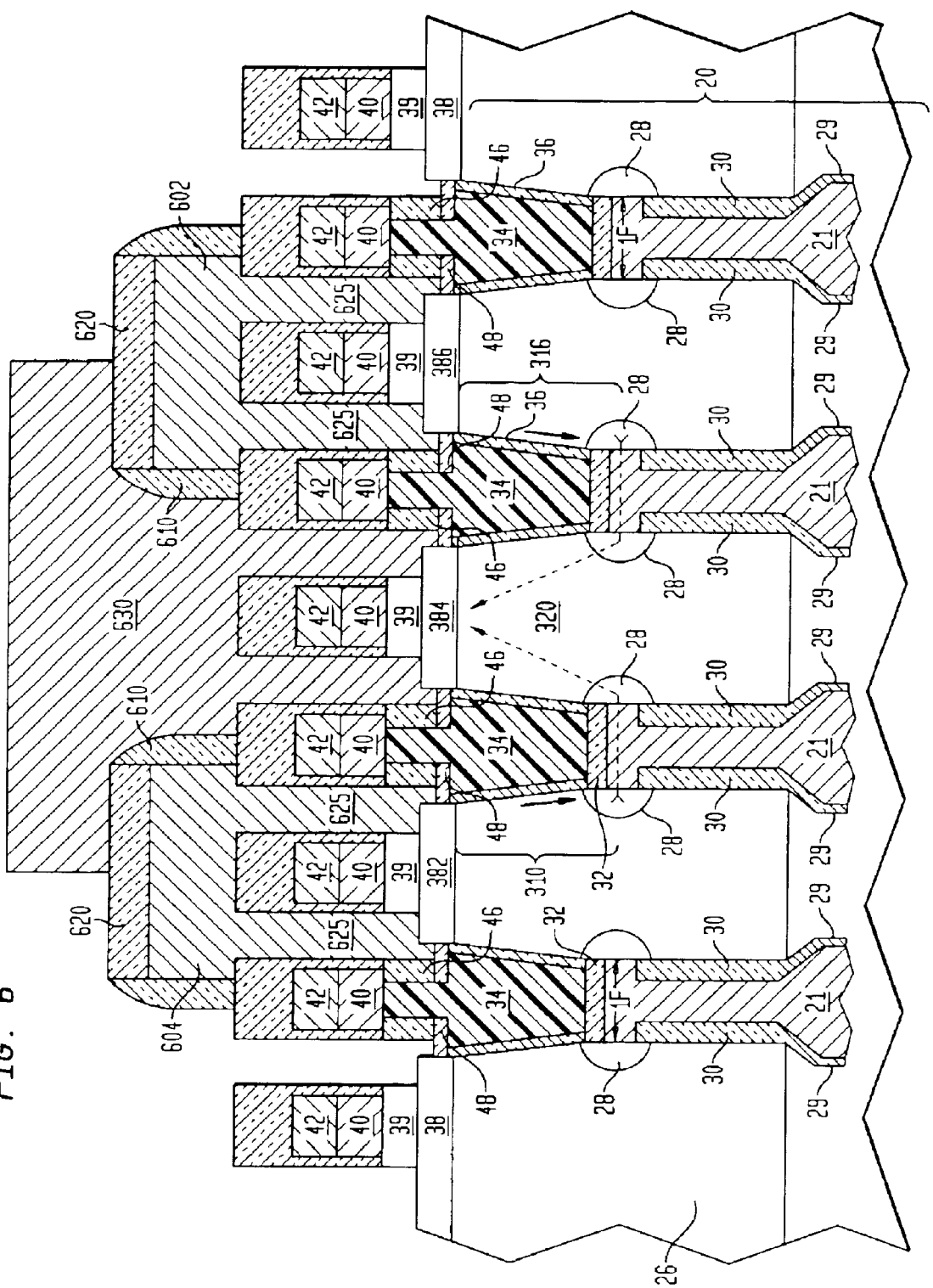
FIG. 6 is a cross-sectional diagram illustrating an alternative configuration of the second embodiment of the invention.

FIG. 6 is a cross-sectional diagram illustrating another embodiment in which a "ground" conductor 630, for providing a conductive path to a fixed potential such as ground, is formed borderlessly to the second conductors 602 and 604 which correspond generally to the second conductors 302 and 304 shown in FIG. 4. In a borderless process, a subsequently used pattern is not required to allow space for avoiding contact with prior formed conductive patterns, because the prior conductive patterns are insulated. In this case, second conductors 602 and 604 are provided with insulating sidewall spacers 610 and insulating caps 620, which insulate them from the subsequent etching of a contact hole or contact trench, and deposition therein to form the conductor 630. When the conductor 630 is formed borderlessly to the conductors 602 and 604, as here, the number of, and the area of the contacts 625 from second conductors 602 and 604 to the drain regions 382 and 384 is doubled, as compared to the embodiment shown in FIG. 4 in which only one contact 323 or 329 is provided per transistor 310 and 316, respectively. In other respects, the embodiment shown in FIG. 6 does not vary in structure or operation from the embodiment shown and described above with reference to FIGS. 4 and 5.

As these and other variations and combinations of the features discussed above can be utilized, the foregoing description of the preferred embodiments should be taken by way of illustration, rather than by limitation of the invention, as defined by the claims.

What is claimed is:

1. An integrated circuit including a plurality of electrostatic discharge (ESD) protection circuits comprising:
   a semiconductor substrate;
   a plurality of trenches formed in the semiconductor substrate;
   a node electrode filling the lower portion of each trench of said plurality of trenches;
   a plurality of doped buried source regions, one each adjacent each of said plurality of trenches at an intermediate level;
   a plurality of drain regions formed on the surface of said semiconductor substrate and between adjacent ones of said plurality of trenches;
   at least one vertical transistor formed partially in an upper portion of each of said plurality of trenches, each of said vertical transistors further comprising one of said plurality of drain regions and one of said doped buried source region;
   a plurality of doped buried plate regions, one each located adjacent the lower portion of each one of said plurality of trenches;
   a group of electronic circuits other than ESD protection circuits formed in a first group of said plurality of trenches, said group of electronic circuits comprising a first group of said vertical transistors connected to said node electrode and said doped buried plate region of said trench, said node electrode and said doped buried plate region connected to form a capacitor; and
   a group of ESD protection circuits formed in a second group of said plurality of trenches, said group of ESD protection circuits comprising a second group of said vertical transistors and said doped buried plate region adjacent said trenches, said doped buried source region of said second group of transistors extended so as to be in electrical contact with said doped buried plate region.

2. The integrated circuit of claim 1 wherein at least some of said group of ESD protection circuits formed in the substrate are located under a bond pad of the integrated circuit.

3. The integrated circuit of claim 2 wherein all of said group of ESD protection circuits formed in the substrate are located under the bond pad.

4. The integrated circuit of claim 1 wherein said plurality of vertical transistors include vertical transistors formed along sidewalls of said trenches in the semiconductor substrate.

5. The integrated circuit of claim 4 wherein said second group of vertical transistors formed along sidewalls of said trenches are adapted to conduct current to the substrate through said doped buried plate region of the substrate lying below said vertical transistors.

6. The integrated circuit of claim 4 wherein said second group of vertical transistors formed along sidewalls of said trenches are adapted to conduct current to the substrate through said node electrode occupying said trenches.

7. The integrated circuit of claim 4 wherein said vertical transistors formed along sidewalls of said trenches are coupled to conduct current away from the substrate through regions of said substrate contacted by conductive patterns overlying said substrate.

8. The integrated circuit of claim 4 wherein said vertical transistors include n-type field effect transistors (NFETs) having grounded gates.

9. The integrated circuit of claim 4 wherein said doped buried plate region is coupled to a conduction band of said substrate held at a fixed potential.

10. The integrated circuit of claim 1 wherein two vertical transistors are formed in each trench of said plurality of trenches.

11. The integrated circuit of claim 1 further comprising a doped gate material filing a portion of each of said plurality of trenches above said oxide layer.

12. The integrated circuit of claim 2 where the drain region of at least one of said second group of transistors is electrically connected to said bond pad.

13. The integrated circuit of claim 11 wherein said buried source region and said gate material of said second group of transistors is connected to ground.

14. The integrated circuit of claim 11 wherein said buried source regions and said gate material of said second group of transistors is connected to a potential below the threshold voltage of said second group of transistors.

15. The integrated circuit of claim 1 and further comprising a collar dielectric on each of the side walls of said trenches below said buried source regions.

16. The integrated circuit of claim 1 further comprising a node dielectric between said node electrode and an associated doped buried plate region.

17. The integrated circuit of claim 14 where selected ones of said vertical transistors are formed in an n-type well between first and second p-type wells and a pair of trenches of said second group of trenches.

18. The integrated circuit of claim 14 wherein the vertical transistors formed in said n-type well is connected to a conductor that is connected to ground.

19. The integrated circuit of claim 18 further comprising other conductors connected to vertical transistor formed in a p-type well.

20. The integrated circuit of claim 19 wherein said other conductors include insulating side wall spacers and caps to provide electrical isolation with said conductor connected to said transistor formed in said n-type wells.

21. An integrated circuit including a plurality of electrostatic discharge (ESD) protection circuits comprising:

a semiconductor substrate;

a plurality of trenches formed in the semiconductor substrate;

a node electrode filling the lower portion of each trench of said plurality of trenches;

an oxide layer located above said node electrode at an intermediate level in each of said trenches;

an oxide layer on the side walls of each of said plurality of trenches above said oxide layer;

a doped gate filling a portion of each of said plurality of trenches above said oxide layer and in contact with said gate oxide layer;

a plurality of doped buried source regions, one each adjacent each of said plurality of trenches at said intermediate level;

a plurality of drain regions formed on the surface of said semiconductor substrate and between adjacent ones of said plurality of trenches;

at least one vertical transistor formed at an upper portion of each of said plurality of trenches, each of said vertical transistors further comprising one of said plurality of drain regions and one of said doped buried source region;

a plurality of doped buried plate regions, one each located adjacent the lower portion of each one of said plurality of trenches;

a group of memory cells formed in a first group of said plurality of trenches, said group of memory cells comprising a first group of said vertical transistors connected to said node electrode and said doped buried plate region of said trench, said node electrode and said doped buried plate region connected to form a capacitor; and a group of ESD protection circuits formed in a second group of said plurality of trenches, said group of ESD protection circuits comprising a second group of said vertical transistors and said doped buried plate region adjacent said trenches, said doped buried source region of said second group of transistors extended so as to be in electrical contact with said doped buried plate region.

* * * * *